US012103285B2

(12) United States Patent
Tu et al.

(10) Patent No.: US 12,103,285 B2
(45) Date of Patent: Oct. 1, 2024

(54) LIQUID CRYSTAL POLYMER FILM AND LAMINATE COMPRISING THE SAME

(71) Applicant: Chang Chun Plastics Co., Ltd., Taipei (TW)

(72) Inventors: An-Pang Tu, Taipei (TW); Chia-Hung Wu, Taipei (TW); Chien-Chun Chen, Taipei (TW)

(73) Assignee: CHANG CHUN PLASTICS CO., LTD., Taipei (TW)

( * ) Notice: Subject to any disclaimer, the term of this patent is extended or adjusted under 35 U.S.C. 154(b) by 0 days.

(21) Appl. No.: 16/748,846

(22) Filed: Jan. 22, 2020

(65) Prior Publication Data

US 2021/0189075 A1 Jun. 24, 2021

(30) Foreign Application Priority Data

Dec. 23, 2019 (TW) ................................ 108147226

(51) Int. Cl.
| *B32B 3/30* | (2006.01) |
| *B32B 15/08* | (2006.01) |
| *B32B 15/20* | (2006.01) |
| *C08J 5/18* | (2006.01) |
| *C08G 63/06* | (2006.01) |
| *C08G 63/83* | (2006.01) |

(52) U.S. Cl.
CPC ................ *B32B 3/30* (2013.01); *B32B 15/08* (2013.01); *B32B 15/20* (2013.01); *C08J 5/18* (2013.01); *B32B 2250/40* (2013.01); *B32B 2307/538* (2013.01); *C08G 63/065* (2013.01); *C08G 63/83* (2013.01); *C08J 2367/04* (2013.01)

(58) Field of Classification Search
CPC .......... B32B 3/30; B32B 15/08; B32B 15/20; B32B 2307/538; B32B 2250/40; C08G 63/83; C08G 63/065; C08J 5/18; C08J 2367/04
See application file for complete search history.

(56) References Cited

U.S. PATENT DOCUMENTS

| 5,534,209 | A | 7/1996 | Moriya |
| 5,746,949 | A | 5/1998 | Shen et al. |
| 5,998,804 | A | 12/1999 | Suh et al. |
| 6,859,241 | B2 | 2/2005 | Hamamoto |
| 9,874,439 | B2 | 1/2018 | Bucher |
| 2002/0060309 | A1 | 5/2002 | Jester |
| 2006/0048963 | A1* | 3/2006 | Nishinaka ............. B32B 15/08 174/393 |
| 2009/0033839 | A1 | 2/2009 | Fukuda |
| 2014/0135469 | A1 | 5/2014 | Kim et al. |
| 2017/0347464 | A1* | 11/2017 | Hashizume ............. B32B 15/08 |
| 2018/0147815 | A1 | 5/2018 | Hashizume |
| 2018/0230317 | A1 | 8/2018 | Seo |
| 2019/0091970 | A1 | 3/2019 | Ueki |
| 2019/0160728 | A1 | 5/2019 | Higashioji |
| 2019/0352456 | A1 | 11/2019 | Hsiang et al. |
| 2020/0407639 | A1 | 12/2020 | Liao |
| 2021/0187884 | A1 | 6/2021 | Tu |
| 2021/0189118 | A1 | 6/2021 | Tu |
| 2021/0189242 | A1 | 6/2021 | Tu |

FOREIGN PATENT DOCUMENTS

| CN | 1235173 | A | 11/1999 |
| CN | 101423652 | A | 5/2009 |
| CN | 101921469 | A | 12/2010 |
| CN | 102085708 | A | 6/2011 |
| CN | 102574362 | | 7/2012 |
| CN | 102574362 | A | 7/2012 |
| CN | 103069933 | A | 4/2013 |
| CN | 107637184 | A | 1/2018 |
| CN | 109180979 | A | 1/2019 |
| CN | 109196716 | | 1/2019 |
| CN | 110073282 | | 7/2019 |
| CN | 211297149 | U | 8/2020 |
| CN | 111808542 | A | 10/2020 |
| CN | 112586096 | A | 3/2021 |
| CN | 115768820 | A | 3/2023 |
| EP | 3424703 | A1 | 1/2019 |
| JP | H05-214253 | A | 8/1993 |
| JP | 6-240019 | A | 8/1994 |
| JP | H07-251438 | A | 10/1995 |
| JP | 8-090570 | A | 4/1996 |
| JP | H08281817 | A | 10/1996 |
| JP | 2587510 | B2 | 3/1997 |
| JP | 2962459 | B2 | 10/1999 |
| JP | 2000006351 | A | 1/2000 |

(Continued)

OTHER PUBLICATIONS

Translation to English for JP 2005-297405 A via espacenet. access Sep. 8, 2020 (Year: 2005).*
Translation to English of WO2016/136537 via patentscope.wipo. int. accessed May 3, 2022 (Year: 2016).*
Translation to English for JP2007/092036 A via espacenet. accessed Aug. 22, 2022 (Year: 2007).*
Japan Examination Report dated Jul. 21, 2020.
Korea Examination Report dated Jun. 29, 2020.
Korean Paten Office "Notice of Allowance" dated Nov. 24, 2020, Korea.

(Continued)

*Primary Examiner* — Nancy R Johnson
(74) *Attorney, Agent, or Firm* — WPAT, PC

(57) ABSTRACT

Provided are a liquid crystal polymer (LCP) film and a laminate comprising the same. The LCP film has a first surface and a second surface opposite each other, and a ratio of a ten-point mean roughness relative to a maximum height (Rz/Ry) of the first surface is from 0.30 to 0.62. By controlling Rz/Ry of at least one surface of the LCP film, the peel strength of the LCP film stacked to a metal foil can be increased, and the laminate comprising the same can still maintain the merit of low insertion loss.

14 Claims, No Drawings

(56) References Cited

FOREIGN PATENT DOCUMENTS

| | | |
|---|---|---|
| JP | 2000044797 A | 2/2000 |
| JP | 2003-340918 A | 12/2003 |
| JP | 2004-323663 A | 11/2004 |
| JP | 2004322482 A | 11/2004 |
| JP | 2005-297405 | 10/2005 |
| JP | 2005297405 A * | 10/2005 |
| JP | 2006-001185 | 1/2006 |
| JP | 2006-249159 | 9/2006 |
| JP | 3896324 B2 | 3/2007 |
| JP | 2007-092036 | 4/2007 |
| JP | 2007092036 A * | 4/2007 |
| JP | 2007-126578 A | 5/2007 |
| JP | 2007-217579 A | 8/2007 |
| JP | 4091209 B2 | 5/2008 |
| JP | 2008-221488 A | 9/2008 |
| JP | 2008291168 | 12/2008 |
| JP | 2009164596 A | 7/2009 |
| JP | 2010-076295 A | 4/2010 |
| JP | 2010147442 A | 7/2010 |
| JP | 2011005803 | 1/2011 |
| JP | 2011071815 A | 4/2011 |
| JP | 2011-216598 A | 10/2011 |
| JP | 2012089608 A | 5/2012 |
| JP | 2012-167224 A | 9/2012 |
| JP | 2012-186453 A | 9/2012 |
| JP | 2013155415 A | 8/2013 |
| JP | 2014208438 A | 11/2014 |
| JP | 2015043401 A | 3/2015 |
| JP | 2015066910 A | 4/2015 |
| JP | 2015077783 A | 4/2015 |
| JP | 2016084528 A | 5/2016 |
| JP | 2016107505 | 6/2016 |
| JP | 2016129949 A | 7/2016 |
| JP | 2016537514 A | 12/2016 |
| JP | 2017-031442 A | 2/2017 |
| JP | 2017-135216 A | 8/2017 |
| JP | 2017189894 A | 10/2017 |
| JP | 2018028147 A | 2/2018 |
| JP | 2018-121085 A | 8/2018 |
| JP | 2018/186223 A1 | 10/2018 |
| JP | 2018-172785 A | 11/2018 |
| JP | 2018-533065 A | 11/2018 |
| JP | 2018168409 A | 11/2018 |
| JP | 2019-043980 A | 3/2019 |
| JP | 2019-135301 A | 8/2019 |
| JP | 2019152853 A | 9/2019 |
| KR | 20050043649 | 5/2005 |
| KR | 10-2009-0077767 A | 7/2009 |
| KR | 10-2012-0074230 A | 7/2012 |
| KR | 20160065942 | 6/2016 |
| KR | 10-2017-0103835 A | 9/2017 |
| TW | 201251533 A | 12/2012 |
| TW | 201417646 | 5/2014 |
| TW | 201533280 A | 9/2015 |
| TW | 201836857 A | 10/2018 |
| TW | I644789 B | 12/2018 |
| TW | 201928029 | 7/2019 |
| TW | I668333 B | 8/2019 |
| TW | 201939077 | 10/2019 |
| TW | 201941933 | 11/2019 |
| TW | I687465 B | 3/2020 |
| TW | I697549 | 7/2020 |
| TW | I735396 B | 8/2021 |
| TW | I741912 B | 10/2021 |
| WO | 2010093009 A1 | 8/2010 |
| WO | 2010139053 A1 | 12/2010 |
| WO | 2011111826 A1 | 9/2011 |
| WO | 2012/117850 A1 | 9/2012 |
| WO | 2013021893 A1 | 2/2013 |
| WO | 2013108563 A1 | 7/2013 |
| WO | 2016104420 A | 6/2016 |
| WO | 2016136537 A | 9/2016 |
| WO | 2016170779 A1 | 10/2016 |
| WO | WO2016159060 A1 | 10/2016 |
| WO | 2016174868 A1 | 11/2016 |
| WO | 2016194964 A | 12/2016 |
| WO | 2018/181223 A1 | 10/2018 |
| WO | 2018/186223 A1 | 10/2018 |
| WO | 2018181222 A1 | 10/2018 |
| WO | WO2020009230 A1 | 1/2020 |
| WO | WO2020149324 A1 | 7/2020 |
| WO | 2020156181 A1 | 8/2020 |

OTHER PUBLICATIONS

Taiwan Examination Report of related TW109144672 dated 02/23/201, Taiwan.
Taiwan Examination Report of related TW 109144674 dated Feb. 25, 2021, Taiwan.
Maha Mekkawy et al. "Comparative study of surface roughness between polyamide, thermoplastic polymethyl methacrylate and acetal resins flexible denture base materials before and after polishing". Published Date: Oct. 7, 2015. http://www.lifesciencesite.com.
Taiwan Examination Report of related TW 109144673 (dated Mar. 24, 2021).
Taiwan Examination Report of related TW 109117530 (dated May 24, 2021).
Taiwan Notice of Allowance of related TW 109117530 (dated Aug. 6, 2021).
Japan Statement of Opposition of related JP 6804673 (receiving date: Jul. 16, 2021).
Korea Statement of Opposition of related KR 10-2197515 (receiving date: Aug. 6, 2021).
Author: MISUMI Co., title: Misumi-vona technical report, URL: https://jp.misumi-ec.com/tech-info/categories/technical_data/td01/g0103.html(upload date: Mar. 6, 2021).
Examination Report of JP2020-199487 (dated Aug. 24, 2021).
Examination Report of JP2020-210267 (dated Oct. 5, 2021).
Examination Report of JP2020-210276 (dated Oct. 12, 2021).
Examination Report of JP2020-166621 (dated Nov. 2, 2021).
Examination Report of KR10-2020-0180055 (dated Dec. 10, 2021).
Examination Report of KR10-2020-0128117 (dated Dec. 22, 2021).
Examination Report of KR10-2020-0180073 (dated Dec. 29, 2021).
Vlachopoulos J., Polychronopoulos N.D., Tanifuji S., Peter Müller J. (2012).
Third Party Observation of JP2020-210276(receiving date: Oct. 19, 2021).
Third Party Observation of JP2020-166621(receiving date: Oct. 26, 2021).
Notice of Allowance of JP2020-210267 (dated Jan. 11, 2022).
Notice of Cancellation Grounds of KR10-2020-0044558 (receiving date: Dec. 27, 2021).
Third Party Observation of KR10-2020-0128117 (receiving date: Feb. 4, 2022).
Third Party Observation of KR10-2020-0180073 (receiving date: Feb. 22, 2022).
Third Party Observation 2 of JP2020-166621 (receiving date: Mar. 8, 2022).
Third Party Observation of JP2020-210284 (receiving date: Apr. 12, 2022).
Evaluation of the strength of single lap joint by using geomertrical and adhesive color information (2015).
Web page for introduction of kurtosis.
Convertech, 2001.
Examination Report of U.S. Appl. No. 17/012,105 (dated Mar. 11, 2022).
Third Party Observation 1 of JP2020-166621 (receiving date: Mar. 8, 2022).
Examination Report of JP2020-199487 (dated Mar. 22, 2022).
Examination Report of JP2020-166621 (dated Apr. 19, 2022).
Final Examination Report of JP2020-210276 (dated Mar. 15, 2022).
Third Party Observation of KR10-2020-1080090 (receiving date: Feb. 22, 2022).
Notice of Allowance of KR10-2020-0180055 (dated Apr. 14, 2022).
Catalog of Fukuda Metal Foil & Powder Co., Ltd. (2015).
Technical Report of Panasonic Corporation (2011).

(56) References Cited

OTHER PUBLICATIONS

Japanese dictionary Kojien 7th edition.
Technical Report of IEICE (1999).
Measures against molding defects in easy extrusion molding (1984).
Web page for Surface Roughness Measurement-Parameters.
The 26th Spring Lecture Meeting of the Electronics Packaging Society (2012).
IPAB Decision on Appeal of KR10-2020-0044558 (receiving date: May 17, 2022).
Final Examination Report of KR10-2020-0180073 (dated Apr. 28, 2022).
Examination Report of KR10-2020-0128117 dated Jun. 22, 2022).
Okamoto et al. Newly developed LCP film (2005), Sumitomo Chemical Co. Ltd., Japan.
Third Party Observation of JP2020-210284 (receiving date: May 23, 2022).
Resilience Brother, 5G communication material—liquid crystal polymer LCP (2020), Text/Meter Polymer.
Hajnys et al. Quality of Surface Texture (2021) Polymers, MDPI.
Recent Market and Application Development of Liquid Crystal Polymers (2003).
Wang, Synthesis and Self-assembled Nanostructures of Rectangular Liquid Crystals (2007) National Chiao Tung Unversity, Taiwan.
Technologies & Applications of LCP (2004).
Vecstar catalog, Kuraray Co. Ltd. (2012), Japan.
Tanaka et al. LCP material for LSI Mounting (1999).
6-hydroxy-2-naphthoic acid, Tcichemicals.com, Japan.
4-hydroxybenzoic acid, Wikipedia.
Notice of Allowance of TW109144672 (dated Jun. 17, 2021).
Notice of Allowance of TW109144673 (dated Aug. 19, 2021).
Notice of Allowance of TW109144674 (dated May 6, 2021).
Notice of Allowance of TW108147226 (dated May 19, 2020).
Notice of Allowance for Appeal of JP2020-210276 (dated Aug. 2, 2022).
Examination Report of JP2020-210284 (dated Aug. 2, 2022).
Examination Report of U.S. Appl. No. 17/126,413 (dated Aug. 2, 2022).
Standard Test Method for Haze and Luminous Transmittance of Transparent Plastics (ASTM D1003).
NDH5000 Haze Meter Introduction, 2007. Nippon Denshoku Industries Co. Ltd.
Third Party Observation of JP2020-199487 (receiving date: Dec. 14, 2021).
Geometrical Product Specifications (JISB0601:2013), 1997, Japanese Industrial Standard.
Notice of Allowance of JP2020-021487 (dated Nov. 4, 2020).
Examination Report of JP2020-166621 (dated Jan. 17, 2023).
Examination Report of CN202011494501.1 (dated Jan. 5, 2023).
Examination Report of KR10-2020-0180090 (dated Dec. 21, 2022).
Final Examination Report of U.S. Appl. No. 17/126,446 (dated Jan. 12, 2023).
Notice of Reason of Cancellation of JP2020-210267 (dated Nov. 15, 2022)
Decision on Opposition of JP2020-21487 (issuing date: Sep. 13, 2021).
Third Party Observation of JP2020-166621 (issuing date: Dec. 6, 2022).
Third Party Observation of JP2020-210284 (issuing date: Jan. 24, 2023).
Notice of Allowance of KR10-2020-0128117 (dated Dec. 28, 2022).
Notice of Allowance of U.S. Appl. No. 17/012,105 (dated Nov. 17, 2022).
Notice of Allowance of U.S. Appl. No. 17/126,413 (dated Nov. 15, 2022).
Notice of Allowance of U.S. Appl. No. 17/126,431 (dated Feb. 9, 2023).
Corrected Notice of Allowance 1 of U.S. Appl. No. 17/012,105 (dated Dec. 23, 2022).
Corrected Notice of Allowance 2 of U.S. Appl. No. 17/012,105 (dated Jan. 23, 2023).
Corrected Notice of Allowance 3 of U.S. Appl. No. 17/012,105 (dated Feb. 15, 2023).
Supplemental NOA 1 of U.S. Appl. No. 17/126,413 (issuing date: Jan. 20, 2023).
Supplemental NOA 2 of U.S. Appl. No. 17/126,413 (issuing date: Feb. 8, 2023).
Email related to U.S. Appl. No. 17/012,105 received on Dec. 15, 2022 and its brief comment.
Email related to U.S. Appl. No. 17/126,413 received on Dec. 28, 2022 and its brief comment.
New Product Introduction—for Flexible Display, published by Nippon Fine Chemical, webpage <URL: https://www.nipponseika.co.jp/business/nsc/flexible-display/>, Mar. 19, 2022, retrieved from google <https://www.google.com/search?q=inurl%3Ahttps%3A%2F%2Fwww.nipponseika.co.jp%2Fbusiness%2Fnsc%2Fflexible-display%2F&rlz=1C1GCEU_zh-TWTW827TW827&oq=inurl%3Ahttps%3A%2F%2Fwww.nipponseika.co.jp%2Fbusiness%2Fnsc%2Fflexible-display%2F&aqs=chrome..69i57j69i58.38906j0j15&sourceid=chrome&ie=UTF-8&as_qdr=y15> on Apr. 10, 2023.
LED light—the different between warm light and cool light, published by Ching Yuang Co. Ltd, webpage <URL: https://yuanglight.com/2498/zh-the-difference-between-warm-white-and-cool-white/>, May 14, 2022.
Insertion Loss Comparisons of Common High Frequency PCB Constructions; John Coonrod, Rogers Corporation; published in the IPC APEX EXPO Conference Proceedings; Feb. 20, 2013.
The Analysis and Comparison of the Standard Test Methods for Haze of Transparent Mediums, published by Center for Measurement Standards/ITRI, Nov. 20, 2005.
Turbidity Meter Haze Meter NDH 5000, published by INCOM, webpage <URL: https://www.incom.co.jp/products/detail.php?company_id=4182&poduct_id=1178>, Jun. 8, 2017.
About the mechanical and electrical properties of polyethylene; published by Tokyo Electric Power Company Holdings, Inc.; Jun. 12, 2018.
Development of multilayer flex substrate with LCP film, published by Hitachi Cable, Ltd. and Nippon Steel Chemical Co., Ltd., <URL: https://www.magazines007.com/pdf/LCP%20Flex%20Feature%201_25_07.pdf>, 2017, retrieved from publication time of Thesis citing this document <URL: https://ndltd.ncl.edu.tw/cgi-bin/gs32/gsweb.cgi/ccd=C4jc6M/record?r1=1&h1=1>.
Rz, Rku, Ra of examples of JP2020-166621 (Jul. 1, 2021).
Third Party Observation of JP2020-199487 (issuing date: Mar. 22, 2023).
Examination Report of CN202010073759.8 (dated May 20, 2023).
Examination Report of JP2020-199487 (dated Apr. 25, 2023).
Examination Report of JP2020-210284 (dated Mar. 14, 2023).
Examination Report of TW108147226 (dated Mar. 13, 2020).
Examination Report of U.S. Appl. No. 17/126,431 (dated May 3, 2023).
Opposition to JP2020-210276 (issuing date: May 24, 2023).
Decision for Appeal of KR10-2020-0180073 (issuing date: Jun. 7, 2023).
Notice of Allowance of U.S. Appl. No. 17/126,446 (dated Jun. 7, 2023).
Corrected Notice of Allowance of U.S. Appl. No. 17/126,431 (dated Feb. 17, 2023).
Supplemental NOA 1 of U.S. Appl. No. 17/126,431 (issuing date: Mar. 1, 2023).
Supplemental NOA 2 of U.S. Appl. No. 17/126,431 (issuing date: Mar. 15, 2023).
Supplemental NOA 3 of U.S. Appl. No. 17/126,413 (issuing date: Apr. 20, 2023).
Supplemental NOA 4 of U.S. Appl. No. 17/126,413 (issuing date: Apr. 27, 2023).
Supplemental NOA 5 of U.S. Appl. No. 17/126,413 (issuing date: May 5, 2023).
Supplemental NOA 6 of U.S. Appl. No. 17/126,413 (issuing date: May 22, 2023).
A Comparative Study of Aerosol Jet Printing on Polyimide and Liquid Crystal Polymer Substrates for RF Applications; Mohammed Alhendi et al.; Published in 2020 IEEE 70th Electronic Components and Technology Conference (ECTC), Aug. 5, 2020.

(56) References Cited

OTHER PUBLICATIONS

Panasonic FELIOS LCP, published by Panasonic, Jun. 2019.
Commercialization of Low Transmission Loss Flexible Multilayer Circuit Board Materials, published by Panasonic Holdings Co., Ltd., webpage <URL: https://news.panasonic.com/jp/press/jn170117-3>, Jan. 17, 2017.
Introduction of Roughness, published by KEYENCE corporation, webpage <URL: https://www.keyence.co.jp/ss/products/microscope/roughness/basics/type.jsp>, <URL: https://www.keyence.co.jp/ss/products/microscope/roughness/surface/parameters/sa.jsp> and <URL: https://www.keyence.co.jp/ss/products/microscope/roughness/surface/parameters/sz.jsp>, retrieved on Dec. 28, 2022.
Development trends of high-frequency compatible materials and their application to 5G and millimeter-wave radar, published by Technical information association, Jun. 7, 2019.
Development technology of liquid crystal polymer-High performance and high functionality, published by CMC Publishing Co., Ltd., Dec. 22, 2009.
Electronics Materials for the Ubiquitous Era, published by CMC Publishing Co., Ltd., Dec. 26, 2003.
Information of 4-Hydroxybenzoic Acid, published by Tokyo Chemical Industry Co., Ltd., webpage <URL: https://www.teichemicals.com/JP/ja/p/H0207>, Dec. 18, 2021, retrieved from Internet Archive <https://web.archive.org/web/20230000000000*/https://www.tcichemicals.com/JP/ja/H0207> on Apr. 12, 2023.
2008 (Gyo-ke) No. 10096 Intellectual Property High Court Judgment, published by Intellectual Property High Court, Jan. 28, 2009.
ISO Home Page for ISO 25178 2:2021, published by International Organization for Standardization, webpage <https://www.iso.org/standard/74591.html>, Dec. 2021.
Data sheet of ULTRALAM3000 Liquid Crystalline Polymer Circuit Material, published by Rogers Corporation, May 10, 2011.
Notice of Allowance of JP2020-210284 (dated Oct. 3, 2023).
Supplemental NOA 1 of U.S. Appl. No. 17/126,431 (issuing date: Oct. 4, 2023).
Supplemental NOA 1 of U.S. Appl. No. 17/126,413 (issuing date: Oct. 4, 2023).
Notice of Allowance of JP2020-199487 (dated Oct. 10, 2023).
Supplemental NOA 2 of U.S. Appl. No. 17/126,413 (issuing date: Oct. 27, 2023).
Supplemental NOA 2 of U.S. Appl. No. 17/126,431 (issuing date: Nov. 6, 2023).
Corrected NOA of U.S. Appl. No. 17/126,446 (issuing date: Nov. 16, 2023).
Notice of Grounds for Revocation of JP7125468 (dated Dec. 19, 2023).
Opinion of Patent Opponent of JP7125468 (dated Dec. 19, 2023).
Chemical Machining by Ferric Chloride Etchant, Ryuji Ueda (Toppan Printing Co., Ltd.), published by Boshoku Gijutsu, 38, 213-237 (Apr. 15, 1989), attached with the Opinion of Patent Opponent of JP7125468.
Electroless Copper Plating on Liquid Crystal Polymer Films, Koji Umehara et. al, published by Electronics Packaging Society Journal, vol. 7 No.4, 328-332 (Jul. 1, 2004), attached with the Opinion of Patent Opponent of JP7125468.
1 Enclosures Catalogue Edition 5, publish by ALLBRO, webpage <URL: https://www.allbro.com/download-catalogue/enclosures.pdf>, Oct. 28, 2020, retrieved from Internet Archive <https://web.archive.org/web/20201101000000*/https://www.allbro.com/download-catalogue/enclosures.pdf> on Dec. 26, 2023, attached with the Opinion of Patent Opponent of JP7125468.
Corrected Notice of Allowability 1 of the related U.S. Appl. No. 17/126,446 issued on Jan. 11, 2024.
Office Action of the related China application No. 202010073759.8 issued on Jan. 19, 2024.
Corrected Notice of Allowability of the related U.S. Appl. No. 17/126,431 issued on Feb. 8, 2024.
Corrected Notice of Allowability 2 of the related U.S. Appl. No. 17/126,446 issued on Feb. 14, 2024.
Ground for patent invalidation of TWI740515B (issuing date: Apr. 24, 2024).
Ground for patent invalidation of TWI741912B (issuing date: Apr. 24, 2024).
Ground for patent invalidation of TWI735396B (issuing date: Apr. 24, 2024).
Insert loss too large? Did you do this right?, published by Microwave Radio Frequency Network, webpage <URL: https://www.mwrf.net/tech/material/2017/21234.htm>, Apr. 11, 2017.
Looking at PCB material technology development trends and applications from the 2017 JPCA Show (Part 1), published by materialsnet, webpage <URL: https://www.materialsnet.com.tw/DocView.aspx?id=28612>, Oct. 23, 2017.
Third Party Observation of JP2023-064956 (issuing date: May 14, 2024).
Notice of Allowance of CN202011498748.0 (issuing date: May 20, 2024).
Examination Report of CN202011494479.0 (issuing date: May 23, 2024).
Rejection Decision of CN202010073759.8 (issuing date: May 25, 2024).
Decision on Opposition of JP7125468 (issuing date: Jul. 8, 2024).

\* cited by examiner

LIQUID CRYSTAL POLYMER FILM AND LAMINATE COMPRISING THE SAME

CROSS-REFERENCE TO RELATED APPLICATION

Pursuant to 35 U.S.C. § 119(a), this application claims the benefits of the priority to Taiwan Patent Application No. 108147226, filed Dec. 23, 2019. The contents of the prior application are incorporated herein by its entirety.

BACKGROUND OF THE INVENTION

1. Field of the Invention

The present application relates to a polymer film for a laminate, more particularly to a liquid crystal polymer (LCP) film and a laminate comprising the same.

2. Description of the Prior Arts

The rapid development of mobile communication technology has pushed the telecom industry to actively develop the fifth generation mobile networks, abbreviated as 5G so as to optimize the performances, such as the data transmission rate, the response time, and the system capacity, etc. of the fourth generation mobile networks (4G).

Since 5G communication technology uses high-frequency bands for signal transmission, the higher the frequency of the signal, the greater the insertion loss. In order to achieve signal transmission using high-frequency bands, it has been known that an LCP film with low dielectric properties can be chosen to match a metal foil, and they are used to produce a laminate so as to decrease dielectric loss of the signal transmission.

However, the interfacial adhesion between the LCP film and a metal foil is generally insufficient, so components on a circuit board are prone to be detached and thus subsequent lamination processes will be seriously adversely affected. Therefore, the peel strength between the LCP film and the metal foil of conventional laminates still needs improvement in order to develop a laminate that is suitable for 5G products.

SUMMARY OF THE INVENTION

To overcome the shortcomings, the objective of the present application is to enhance the peel strength between an LCP film and a metal foil.

To achieve the aforementioned objective, one aspect of the present application provides an LCP film. The LCP film has a first surface and a second surface opposite each other, and a ratio of a ten-point mean roughness relative to a maximum height (Rz/Ry) of the first surface may be more than or equal to 0.30 and less than or equal to 0.62.

By controlling the Rz/Ry property of either surface (e.g., the first surface) of the LCP film, the adhesion of the LCP film stacked to the metal foil can be increased, thereby enhancing the peel strength between the LCP film and the metal foil. Therefore, the problem such as wire detachment during subsequent processing of a laminate can be avoided.

In accordance with the present application, in terms of the second surface of the LCP film, Rz/Ry thereof may also be more than or equal to 0.30 and less than or equal to 0.62. Herein, regardless of whether the LCP film of the present application is laminated with at least one metal foil through either or both of the first surface and the second surface, the LCP film can possess superior adhesion to the at least one metal foil, thus improving the peel strength between the LCP film and the at least one metal foil. Preferably, Rz/Ry of the first surface and/or Rz/Ry of the second surface of the LCP film of the present application may also be more than or equal to 0.36 and less than or equal to 0.61. In one of the embodiments, Rz/Ry of the first surface and Rz/Ry of the second surface of the LCP film of the present application may be the same or different. In one of the embodiments, Rz/Ry of the first surface and Rz/Ry of the second surface of the LCP film of the present application both fall within the aforementioned ranges.

In accordance with the present application, Rz of the first surface of the LCP film may be less than or equal to 2 micrometers (μm). Preferably, Rz of the first surface of the LCP film of the present application may be less than or equal to 1.5 μm; more preferably, Rz of the first surface of the LCP film of the present application may be more than or equal to 0.3 μm and less than or equal to 1.5 μm; even more preferably, Rz of the first surface of the LCP film of the present application may be more than or equal to 0.3 μm and less than or equal to 1.4 μm; still more preferably, Rz of the first surface of the LCP film of the present application may be more than or equal to 0.3 μm and less than or equal to 1.3 μm; yet still more preferably, Rz of the first surface of the LCP film of the present application may be more than or equal to 0.35 μm and less than or equal to 1.2 μm; even further preferably, Rz of the first surface of the LCP film of the present application may be more than or equal to 0.39 μm and less than or equal to 1.2 μm. In one of the embodiments, Rz of the first surface and Rz of the second surface of the LCP film of the present application may be the same or different. In one of the embodiments, Rz of the first surface and Rz of the second surface of the LCP film of the present application both fall within the aforementioned ranges.

In accordance with the present application, Ry of the first surface of the LCP film may be less than or equal to 2.2 μm. In one of the embodiments, Ry of the first surface of the LCP film of the present application may be less than or equal to 2.0 μm; preferably, Ry of the first surface of the LCP film of the present application may be more than or equal to 0.5 μm and less than or equal to 1.8 μm; more preferably, Ry of the first surface of the LCP film of the present application may be more than or equal to 0.6 μm and less than or equal to 1.6 μm. In one of the embodiments, Ry of the first surface and Ry of the second surface of the LCP film of the present application may be the same or different. In one of the embodiments, Ry of the first surface and Ry of the second surface of the LCP film of the present application both fall within the aforementioned ranges.

Preferably, arithmetic average roughness (Ra) of the first surface of the LCP film of the present application may be less than or equal to 0.09 μm. Herein, applying the LCP film to a laminate can significantly decrease the insertion loss, so that the laminate comprising the LCP film is highly suitable for high-end 5G products.

More preferably, Ra of the first surface of the LCP film of the present application may be more than or equal to 0.02 μm and less than or equal to 0.08 μm; even more preferably, Ra of the first surface may be more than or equal to 0.02 μm and less than or equal to 0.07 μm; still more preferably, Ra of the first surface may be more than or equal to 0.02 μm and less than or equal to 0.06 μm. By means of decreasing Ra of the first surface of the LCP film, the insertion loss of the laminate including the LCP film is further reduced, so that the laminate is highly suitable for high-end 5G products. In one of the embodiments, Ra of the first surface and Ra of the second surface of the LCP film of the present application may be the same or different. In one of the embodiments, Ra of the first surface and Ra of the second surface of the LCP film of the present application both fall within the aforementioned ranges.

In accordance with the present application, the LCP film may be produced by an LCP resin, which is commercially available or made from conventional raw materials. In the present application, the LCP resin is not particularly restricted. For example, aromatic or aliphatic hydroxy compounds such as hydroquinone, resorcin, 2,6-naphthalenediol, ethanediol, 1,4-butanediol, and 1,6-hexanediol; aromatic or aliphatic dicarboxylic acids such as terephthalic acid, isophthalic acid, 2,6-naphthalenedicarboxylic acid, 2-chloroterephthalic acid, and adipic acid; aromatic hydroxy carboxylic acids such as 3-hydroxybenzoic acid, 4-hydroxybenzoic acid, 6-hydroxy-2-naphthalenecarboxylic acid, and 4'-hydroxy-4-biphenylcarboxylic acid; aromatic amine compounds such as p-phenylenediamine, 4,4'-diaminobiphenyl, naphthalene-2,6-diamine, 4-aminophenol, 4-amino-3-methylphenol, and 4-aminobenzoic acid may be used as raw materials to prepare the LCP resin, and the LCP resin is then used to prepare the LCP film of the present application. In one of the embodiments of the present application, 6-hydroxy-2-naphthalenecarboxylic acid, 4-hydroxybenzoic acid, and acetyl anhydride (also called acetic anhydride) may be chosen to obtain the LCP resin, which can be used to prepare the LCP film of the present application. In one of the embodiments, the melting point of the LCP resin may be about 250° C. to 360° C.

In one of the embodiments, a person having ordinary knowledge in the art may add additives such as, but not limited to, lubricants, antioxidants, electrical insulating agents, or fillers during preparation of the LCP film of the present application based on different needs. For example, the applicable additives may be, but are not limited to, polycarbonate, polyamide, polyphenylene sulfide, polyetheretherketone, etc.

In accordance with the present application, the thickness of the LCP film is not particularly restricted. For example, the thickness of the LCP film may be more than or equal to 10 µm and less than or equal to 500 µm; preferably, the thickness of the LCP film of the present application may be more than or equal to 10 µm and less than or equal to 300 µm; more preferably, the thickness of the LCP film of the present application may be more than or equal to 15 µm and less than or equal to 250 µm; even more preferably, the thickness of the LCP film of the present application may be more than or equal to 20 µm and less than or equal to 200 µm.

To achieve the aforementioned objective, another aspect of the present application also provides a laminate, which comprises a first metal foil and the LCP film. The first metal foil is disposed over the first surface of the LCP film.

In one of the embodiments, the laminate of the present application may further comprise a second metal foil, which is disposed over the second surface of the LCP film, i.e., the LCP film of the present application is sandwiched between the first metal foil and the second metal foil. In this embodiment, when the Rz/Ry properties of both of the first surface and the second surface the LCP film are controlled at the same time, the adhesion of the LCP film stacked to the first metal foil and the adhesion of the LCP film stacked to the second metal foils are improved simultaneously, and thus the peel strength between the LCP film and the first metal foil as well as the peel strength between the LCP film and the second metal foil are enhanced.

In accordance with the present application, "stacking" is not limited to direct contact; further, it also includes indirect contact. For example, in one of the embodiments of the present application, the first metal foil and the LCP film in the laminate are stacked with each other in a direct contact manner, that is, the first metal foil is disposed on and in direct contact with the first surface of the LCP film. In another embodiment of the present application, the first metal foil and the LCP film in the laminate are stacked with each other in an indirect contact manner, that is, the first metal foil is disposed above the LCP film, and the first metal foil and the LCP film are stacked with each other in an indirect contact manner. For example, a connection layer may be disposed between the first metal foil and the LCP film based on different needs, so that the first metal foil contacts the first surface of the LCP film via the connection layer. The material of the connection layer may be adjusted according to different needs to provide corresponding functions. For example, the material of the connection layer may include nickel, cobalt, chromium, or alloys thereof to provide functions such as thermal resistance, chemical resistance, or electrical resistance. Similarly, the second metal foil and the LCP film in the laminate may also be stacked with each other in direct contact or indirect contact. In one of the embodiments of the present application, the stacking manner for the LCP film and the first metal foil and the one for the LCP film and the second metal foil may be the same or different.

In accordance with the present application, the first metal foil and/or the second metal foil may be, but are not limited to, copper foil, gold foil, silver foil, nickel foil, aluminum foil, stainless steel foil, etc. In one of the embodiments, the first metal foil and the second metal foil are made of different materials. Preferably, the first metal foil and/or the second metal foil may be copper foil, so that the copper foil and the LCP film are stacked to form a copper clad laminate (CCL). In addition, the manufacturing method of the first metal foil and/or the manufacturing method of the second metal foil are not particularly restricted, as long as the methods do not violate the objective of the present application. For example, the metal foil may be produced by, but not limited to, a roll-to-roll method or an electrodeposition method.

In accordance with the present application, the thickness of the first metal foil and/or the second metal foil is not particularly restricted and can be adjusted based on different needs by a person having ordinary knowledge in the art. For example, in one of the embodiments, the thickness of the first metal foil and/or the second metal foil may independently be more than or equal to 1 µm and less than or equal to 200 µm; preferably, the thickness of the first metal foil and/or the second metal foil may independently be more than or equal to 1 µm and less than or equal to 40 µm; more preferably, the thickness of the first metal foil and/or the second metal foil may independently be more than or equal to 1 µm and less than or equal to 20 µm; even more preferably, the thickness of the first metal foil and/or the second metal foil may independently be more than or equal to 3 µm and less than or equal to 20 µm.

In accordance with the present application, surface treatments of the first metal foil and/or the second metal foil of the present application can be conducted based on different needs by a person having ordinary knowledge in the art. For example, the surface treatments may be selected from, but not limited to, roughening treatments, acid-base treatments, thermal treatments, degreasing treatments, ultraviolet irradiation treatments, corona discharge treatments, plasma treatments, primer coating treatments, etc.

In accordance with the present application, the roughness of the first metal foil and/or the second metal foil is not particularly restricted and can be adjusted according to different needs by a person having ordinary knowledge in the art. In one of the embodiments, Rz of the first metal foil and/or Rz of the second metal foil may independently be more than or equal to 0.1 µm and less than or equal to 2.0 µm; preferably, Rz of the first metal foil and/or Rz of the second metal foil may independently be more than or equal to 0.1 µm and less than or equal to 1.5 µm. In one of the embodiments, Rz of the first metal foil and Rz of the second metal foil may be the same or different. In one of the embodiments, Rz of the first metal foil and Rz of the second metal foil both fall within the aforementioned ranges.

In one of the embodiments, a third metal foil may be additionally provided based on different needs by a person having ordinary knowledge in the art. The third metal foil may be the same or different from the first metal foil and/or the second metal foil. In one of the embodiments, Rz of the third metal foil may fall within the aforementioned ranges of Rz of the first metal foil and/or Rz of the second metal foil.

In one of the embodiments, the laminate may comprise multiple LCP films. Based on the premise of not violating the spirit of the present application, multiple LCP films of the present application and multiple metal foils, such as the aforesaid first metal foil, second metal foil, and/or third metal foil, may be stacked based on different needs to produce a laminate having the multiple LCP films and the multiple metal foils by a person having ordinary knowledge in the art.

In the specification, the terms "ten-point mean roughness (Rz)", "maximum height (Ry)", and "arithmetic average roughness (Ra)" are defined according to JIS B 0601:1994.

DETAILED DESCRIPTION OF THE PREFERRED EMBODIMENTS

Hereinafter, multiple preparation examples are provided to illustrate raw materials used to produce the LCP film of the present application. Multiple examples are further provided to illustrate the implementation of the LCP film and the laminate of the present application, while multiple comparative examples are provided as comparison. A person skilled in the art can easily realize the advantages and effects of the present application from the following examples and comparative examples. The descriptions proposed herein are just preferable embodiments for the purpose of illustrations only, not intended to limit the scope of the present application. Various modifications and variations could be made in order to practice or apply the present application without departing from the spirit and scope of the present application.

《 LCP Resin 》

Preparation Example 1: LCP Resin

A mixture of 6-hydroxy-2-naphthalenecarboxylic acid (700 g), 4-hydroxybenzoic acid (954 g), acetyl anhydride (1085 g), and sodium phosphite (1.3 g) was charged into a 3-liter autoclave and stirred for acetylation at 160° C. for about 2 hours under nitrogen atmosphere at normal pressure. Subsequently, the mixture was heated to 320° C. at a rate of 30° C. per hour, and then under this temperature condition, the pressure was reduced slowly from 760 torr to 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point about 265° C. and a viscosity about 60 pascal-seconds (Pa·s) measured at 300° C. (hereinafter referred to as @300° C.).

Preparation Example 2: LCP Resin

A mixture of 6-hydroxy-2-naphthalenecarboxylic acid (440 g), 4-hydroxybenzoic acid (1145 g), acetyl anhydride (1085 g), and sodium phosphite (1.3 g) was charged into a 3-liter autoclave and stirred for acetylation at 160° C. for about 2 hours under nitrogen atmosphere at normal pressure. Subsequently, the mixture was heated to 320° C. at a rate of 30° C. per hour, and then under this temperature condition, the pressure was reduced slowly from 760 torr to 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point about 305° C. and a viscosity about 40 Pa·s @300° C.

Preparation Example 3: LCP Resin

A mixture of 6-hydroxy-2-naphthalenecarboxylic acid (540 g), 4-hydroxybenzoic acid (1071 g), acetyl anhydride (1086 g), sodium phosphite (1.3 g), and 1-methylimidazole (0.3 g) was charged into a 3-liter autoclave and stirred for acetylation at 160° C. for about 2 hours under nitrogen atmosphere at normal pressure. Subsequently, the mixture was heated to 320° C. at a rate of 30° C. per hour, and then under this temperature condition, the pressure was reduced slowly from 760 torr to equal to or less than 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point about 278° C. and a viscosity about 45 Pa·s @300° C.

LCP Film

Examples 1 to 13 and Comparative Examples 1 to 5: LCP Film

The LCP resin obtained from Preparation Examples 1 to 3 (PE1 to PE3) was used as raw materials to prepare LCP films of Examples 1 to 13 (E1 to E13) and Comparative Examples 1 to 5 (C1 to C5) by the methods described below.

First, the LCP resin was put into an extruder having a screw diameter of 27 millimeters (mm) (manufacturer: Leistritz, model: ZSE27) and heated to a temperature ranging from 300° C. to 320° C., and then extruded from a T-die of a width of 500 mm with a feeding speed ranging from 3.5 kilograms per hour (kg/hr) to 10 kg/hr. The LCP resin was then delivered to a space between two casting wheels having a temperature ranging from about 250° C. to 320° C. and a diameter ranging from about 35 centimeters (cm) to 45 cm, extruded with a force about 20 kilonewtons (kN) to 60 kN, and then transferred to a cooling wheel for cooling at room temperature to obtain an LCP film having a thickness of 50 µm. Herein, the casting wheels were spaced about 1 mm to 50 mm from the T-die.

The processes of Examples 1 to 13 differ from those of Comparative Examples 1 to 5 in the kind of the LCP resin, the distance from the T-die to the surfaces of the casting wheels, the feeding speed, and the extrusion temperature. The parameters of Examples 1 to 13 and Comparative Examples 1 to 5 are respectively listed in Table 1 below.

TABLE 1 parameters of LCP films of Examples 1 to 13 and Comparative Examples 1 to 5

| Sample No. | LCP Resin | Distance from T-die to casting wheels (mm) | Feeding Speed (kg/hr) | Extrusion Temp. (° C.) |
|---|---|---|---|---|
| E1 | PE1 | 20 | 7.5 | 310 |
| E2 | PE1 | 20 | 7.5 | 315 |
| E3 | PE1 | 20 | 7.5 | 320 |
| E4 | PE1 | 20 | 6.5 | 290 |
| E5 | PE1 | 20 | 8.5 | 310 |
| E6 | PE1 | 20 | 8.5 | 315 |
| E7 | PE1 | 20 | 8.5 | 320 |
| E8 | PE1 | 20 | 5.5 | 310 |
| E9 | PE2 | 20 | 5.5 | 315 |
| E10 | PE3 | 20 | 5.5 | 320 |
| E11 | PE1 | 20 | 6.5 | 310 |
| E12 | PE2 | 20 | 6.5 | 315 |
| E13 | PE3 | 20 | 6.5 | 320 |
| C1 | PE1 | 20 | 7.5 | 300 |
| C2 | PE1 | 20 | 8.5 | 290 |
| C3 | PE1 | 5 | 6.5 | 310 |
| C4 | PE1 | 5 | 5.5 | 320 |
| C5 | PE1 | 5 | 7.5 | 315 |

The above-mentioned preparation method of LCP film is only used to exemplify implementation of the present application. A person having ordinary knowledge in the art may also use conventional methods such as a laminate extension method and an inflation method to prepare an LCP film.

In one of the embodiments, after the LCP resin was extruded from the T-die, the LCP resin might be delivered with two high-temperature resistant films to a space between two casting wheels to form a three-layered laminate based on needs by a person having ordinary knowledge in the art. The two high-temperature resistant films were detached from the LCP resin at room temperature to obtain the LCP film of the present application. The high-temperature resistant film may be selected from, but not limited to, poly (tetrafluoroethene) (PTFE) film, polyimide (PI) film, and poly(ether sulfone) (PES) film.

In addition, post treatments for the obtained LCP film may be conducted based on different needs by a person having ordinary knowledge in the art. The post treatments may be, but are not limited to, polishing, ultraviolet irradiation, plasma, etc. For the plasma treatment, it may be applied with a plasma operated with a power of 1 kW under nitrogen, oxygen, or air atmosphere at a reduced or normal pressure based on different needs, but is not limited thereto.

Test Example 1: Roughness of LCP Films

In this test example, the LCP films of Examples 1 to 13 and Comparative Examples 1 to 5 were used as test samples. The surface morphology images of the test samples were each taken using a laser microscope (manufacturer: Olympus, model: LEXT OLS5000-SAF, objective lens: MPLAPON-50xLEXT) with an objective lens having a magnification power of 50x, 1x optical zoom, and a 405 nanometers (nm) wavelength of light source at a temperature of 24±3° C. and a relative humidity of 63±3%. Ra, Ry, and Rz of either surface of the test samples were measured according to JIS B 0601:1994 using an evaluation length of 4 mm and a cutoff value (xc) of 0.8 mm. The results of the test samples are listed in Table 2 below.

Examples 1A to 13A: Laminates

Laminates of Examples 1A to 13A (E1A to E13A) and Comparative Examples 1A to 5A (CIA to C5A) were produced from the LCP films of Examples 1 to 13 as well as Comparative Examples 1 to 5 and commercially available copper foils. The product descriptions of the commercially available copper foils are provided as follows:

Copper foil 1: CF-T49A-HD2, purchased from FUKUDA METAL FOIL & POWDER CO., LTD., Rz: about 1.2 μm;

Copper foil 2: CF-H9A-HD2, purchased from FUKUDA METAL FOIL & POWDER CO., LTD., Rz: about 1.0 μm;

Copper foil 3: 3EC-M2S-HTE-SP2, purchased from MITSUI MINING & SMELTING CO., LTD., Rz: about 1.1 μm; and Copper foil 4: TQ-M7-VSP, purchased from MITSUI MINING & SMELTING CO., LTD., Rz: about 1.1 μm.

The kind of the LCP film and the kind of the copper foil used for each of the laminates of Examples 1A to 13A and Comparative Examples 1A to 5A were listed in Table 2, and each of the laminates was produced as follows.

The LCP film having a thickness about 50 μm and two identical copper foils each having a thickness about 12 μm were each first cut to size of 20 cm*20 cm. The LCP film was then sandwiched between the two copper foils to form a laminated structure. The laminated structure was subjected to a pressure of 5 kilograms per square centimeter (kg/cm²) for 60 seconds at 180° C., followed by a pressure of 20 kg/cm² for 25 minutes (min) at 300° C., and then cooled to room temperature to obtain a laminate.

Herein, the lamination method for the laminates is not particularly restricted. A person having ordinary knowledge in the art may use conventional techniques such as a wire lamination or a surface lamination to conduct the lamination process. A laminator applicable to the present application may be, but is not limited to, an intermittent hot-press machine, a roll-to-roll wheeling machine, a double belt press machine, etc. According to different needs, a person having ordinary knowledge in the art can also align the LCP film with the copper foils to form a laminated structure, which may then be processed with surface lamination comprising a heating step and a pressing step.

In another embodiment, a metal foil, such as a copper foil, on an LCP film may be formed through sputtering, electroplating, chemical plating, evaporation deposition, etc. based on different needs by a person having ordinary knowledge in the art. Or, a connection layer, such as a glue layer, a nickel layer, a cobalt layer, a chromium layer, or an alloy layer thereof, may be formed between an LCP film and a metal foil based on different needs by a person having ordinary knowledge in the art.

Test Example 2: Peel Strength of Laminates

The peel strength of the laminates was measured according to IPC-TM-650 No.: 2.4.9. The laminates of Examples 1A to 13A and Comparative Examples 1A to 5A were each cut to size of a length about 228.6 mm and a width about 3.2 mm as etched specimens. Each etched specimen was placed at a temperature of 23±2° C. and a relative humidity of 50±5% for 24 hours to reach stabilization. Subsequently, each etched specimen was adhered to a clamp of a testing machine (manufacturer: Hung Ta Instrument Co., Ltd., model: HT-9102) with a double faced adhesive tape. Each etched specimen was then peeled from the clamp with a force at a peel speed of 50.8 mm/min, and the value of the force during the peeling process was continuously recorded. Herein, the force should be controlled within a range of 15% to 85% of the bearable force of the testing machine, the peeling distance from the clamp should be at least more than 57.2 mm, and the force for the initial distance of 6.4 mm was neglected and not recorded. The results are shown in Table 2.

TABLE 2 roughness of LCP films of Examples 1 to 13 and Comparative Examples 1 to 5, and sample number of copper foil and peel strength of laminates of Examples 1A to 13A and Comparative Examples 1A to 5A

| | LCP Film | | | Laminate | |
|---|---|---|---|---|---|
| Sample No. | Rz/Ry | Ra (μm) | Rz (μm) | Sample No. | Copper Foil No. | Peel Strength (kN/m) |
| E1 | 0.483 | 0.029 | 0.506 | E1A | Copper Foil 1 | 0.68 |
| E2 | 0.548 | 0.034 | 0.534 | E2A | Copper Foil 1 | 0.60 |
| E3 | 0.606 | 0.041 | 0.826 | E3A | Copper Foil 1 | 0.58 |
| E4 | 0.422 | 0.092 | 0.793 | E4A | Copper Foil 1 | 0.70 |
| E5 | 0.361 | 0.057 | 1.186 | E5A | Copper Foil 2 | 1.44 |
| E6 | 0.476 | 0.026 | 0.390 | E6A | Copper Foil 2 | 1.38 |
| E7 | 0.553 | 0.036 | 0.735 | E7A | Copper Foil 2 | 1.30 |
| E8 | 0.492 | 0.031 | 0.856 | E8A | Copper Foil 3 | 0.53 |
| E9 | 0.532 | 0.032 | 0.547 | E9A | Copper Foil 3 | 0.48 |
| E10 | 0.566 | 0.033 | 0.602 | E10A | Copper Foil 3 | 0.45 |
| E11 | 0.495 | 0.037 | 0.864 | E11A | Copper Foil 4 | 0.83 |
| E12 | 0.530 | 0.035 | 0.609 | E12A | Copper Foil 4 | 0.85 |
| E13 | 0.567 | 0.037 | 0.591 | E13A | Copper Foil 4 | 0.78 |
| C1 | 0.829 | 0.088 | 1.562 | C1A | Copper Foil 1 | 0.56 |
| C2 | 0.896 | 0.122 | 1.839 | C2A | Copper Foil 1 | 0.53 |
| C3 | 0.685 | 0.043 | 0.717 | C3A | Copper Foil 1 | 0.52 |
| C4 | 0.632 | 0.057 | 1.049 | C4A | Copper Foil 1 | 0.50 |
| C5 | 0.814 | 0.034 | 0.442 | C5A | Copper Foil 2 | 1.18 |

Test Example 3: Insertion Loss of Laminates

The laminates of Examples 1A to 13A and Comparative Examples 1A to 5A were each cut to size of a length about 100 mm, a width about 140 mm, and a resistance about 50 Ohm (Ω) as strip line specimens. The insertion loss of the strip line specimens was measured under 10 GHz by a microwave network analyzer (manufacturer: Agilent Technologies, Ltd., model: 8722ES) including a probe (manufacturer: Cascade Microtech, model: ACP40-250).

The LCP films of Examples 1 to 7 as well as Comparative Examples 1 to 5 were chosen as examples to laminate with the commercially available copper foils, the laminates of Examples 1A to 7A and Comparative Examples 1A to 5A were prepared to evaluate insertion loss, and the results are listed in Table 3 below.

TABLE 3 descriptions of LCP films and copper foils used for laminates of Examples 1A to 7A and Comparative Examples 1A to 5A and insertion loss of the laminates

| | LCP Film | | | Laminate | | |
|---|---|---|---|---|---|---|
| Sample No. | Rz/Ry | Ra (μm) | Rz (μm) | Sample No. | Copper Foil No. | Insertion Loss (dB) |
| E1 | 0.483 | 0.029 | 0.506 | E1A | Copper Foil 1 | −2.9 |
| E2 | 0.548 | 0.034 | 0.534 | E2A | Copper Foil 1 | −2.9 |

TABLE 3-continued descriptions of LCP films and copper foils used for laminates of Examples 1A to 7A and Comparative Examples 1A to 5A and insertion loss of the laminates

| | LCP Film | | | Laminate | | |
|---|---|---|---|---|---|---|
| Sample No. | Rz/Ry | Ra (μm) | Rz (μm) | Sample No. | Copper Foil No. | Insertion Loss (dB) |
| E3 | 0.606 | 0.041 | 0.826 | E3A | Copper Foil 1 | −2.9 |
| E4 | 0.422 | 0.092 | 0.793 | E4A | Copper Foil 1 | −3.1 |
| E5 | 0.361 | 0.057 | 1.186 | E5A | Copper Foil 2 | −2.9 |
| E6 | 0.476 | 0.026 | 0.390 | E6A | Copper Foil 2 | −2.8 |
| E7 | 0.553 | 0.036 | 0.735 | E7A | Copper Foil 2 | −2.9 |
| C1 | 0.829 | 0.088 | 1.562 | C1A | Copper Foil 1 | −3.1 |
| C2 | 0.896 | 0.122 | 1.839 | C2A | Copper Foil 1 | −3.1 |
| C3 | 0.685 | 0.043 | 0.717 | C3A | Copper Foil 1 | −3.0 |
| C4 | 0.632 | 0.057 | 1.049 | C4A | Copper Foil 1 | −2.9 |
| C5 | 0.814 | 0.034 | 0.442 | C5A | Copper Foil 2 | −2.9 |

Discussion on Test Results

As shown in Table 2 above, Rz/Ry of either surface of the LCP film of each of Examples 1 to 13 was controlled within the range between more than or equal to 0.30 and less than or equal to 0.62, so the laminates (Examples 1A to 13A) produced from such LCP films and various commercially available copper foils with low roughness all exhibited high peel strength. In addition, as shown in Table 3 above, take the results of Examples 1A to 7A as examples, when Rz/Ry of either surface of the LCP films was controlled within the range between more than or equal to 0.30 and less than or equal to 0.62, the insertion loss of the laminates of Examples 1A to 7A was modulated to be −3.1 dB or less.

The results of Table 2 were further analyzed. For laminates having Copper foil 1, the laminates with the LCP films of Examples 1 to 4 all exhibited higher peel strength than the ones with the LCP films of Comparative Examples 1 to 4. Similarly, for laminates having Copper foil 2, the laminates with the LCP films of Examples 5 to 7 all exhibited higher peel strength than the one with LCP film of Comparative Example 5. Clearly, the peel strength of the laminates produced from the LCP films of the present application is certainly improved, so the laminates are suitable for processing and problems of component detachment will be effectively avoided.

Furthermore, from the test results of the laminates of Examples 1A to 7A, when either surface of the LCP film has Rz/Ry of more than or equal to 0.30 and less than or equal to 0.62 as well as Ra of less than or equal to 0.09, the peel strength of the laminates (Examples 1A to 3A and 5A to 7A) having the LCP film and copper foils was enhanced, and the insertion loss of the laminates was further reduced to −2.9 dB or less. Thus, the laminates that exhibited high peel strength as well as low insertion loss were provided.

In summary, by controlling Rz/Ry of at least one surface of the LCP film that is more than or equal to 0.30 and less than or equal to 0.62, the peel strength of the LCP film stacked to metal foils can be specifically improved. In addition, by controlling Ra and Rz/Ry of at least one surface of the LCP film, the laminate having the LCP film not only has improved peel strength but also has reduced insertion loss. Therefore, the laminate of the present application is highly suitable for high-end 5G products.

Even though numerous characteristics and advantages of the present application have been set forth in the foregoing description, together with details of the structure and features of the present application, the disclosure is illustrative only. Changes may be made in the details, especially in matters of shape, size, and arrangement of parts within the principles of the present application to the full extent indicated by the broad general meaning of the terms in which the appended claims are expressed.

What is claimed is:

1. A liquid crystal polymer film, comprising a first surface and a second surface opposite each other, a ratio of a ten-point mean roughness relative to a maximum height of the first surface being more than or equal to 0.36 and less than or equal to 0.61, and an arithmetic average roughness of the first surface being less than or equal to 0.09 μm; wherein the ten-point mean roughness, the maximum height, and the arithmetic average roughness are defined according to JIS B 0601:1994.

2. The liquid crystal polymer film as claimed in claim 1, wherein the arithmetic average roughness of the first surface is more than or equal to 0.02 μm and less than or equal to 0.08 μm.

3. The liquid crystal polymer film as claimed in claim 2, wherein a ratio of a ten-point mean roughness relative to a maximum height of the second surface is more than or equal to 0.30 and less than or equal to 0.62.

4. The liquid crystal polymer film as claimed in claim 3, wherein an arithmetic average roughness of the second surface is less than or equal to 0.09 μm.

5. The liquid crystal polymer film as claimed in claim 1, wherein the ten-point mean roughness of the first surface is less than or equal to 2 μm.

6. The liquid crystal polymer film as claimed in claim 5, wherein the ten-point mean roughness of the first surface is less than or equal to 1.5 μm.

7. The liquid crystal polymer film as claimed in claim 6, wherein a ratio of a ten-point mean roughness relative to a maximum height of the second surface is more than or equal to 0.30 and less than or equal to 0.62.

8. The liquid crystal polymer film as claimed in claim 7, wherein an arithmetic average roughness of the second surface is less than or equal to 0.09 μm.

9. The liquid crystal polymer film as claimed in claim 5, wherein a ratio of a ten-point mean roughness relative to a maximum height of the second surface is more than or equal to 0.30 and less than or equal to 0.62.

10. The liquid crystal polymer film as claimed in claim 9, wherein an arithmetic average roughness of the second surface is less than or equal to 0.09 μm.

11. The liquid crystal polymer film as claimed in claim 1, wherein a ratio of a ten-point mean roughness relative to a maximum height of the second surface is more than or equal to 0.30 and less than or equal to 0.62.

12. The liquid crystal polymer film as claimed in claim 11, wherein an arithmetic average roughness of the second surface is less than or equal to 0.09 μm.

13. A laminate, comprising a first metal foil and the liquid crystal polymer film as claimed in claim 1, the first metal foil disposed over the first surface of the liquid crystal polymer film.

14. The laminate as claimed in claim 13, wherein the laminate comprises a second metal foil, and the second metal foil is disposed over the second surface of the liquid crystal polymer film.

* * * * *